(12) United States Patent
Cho et al.

(10) Patent No.: US 10,896,911 B2
(45) Date of Patent: Jan. 19, 2021

(54) METHOD FOR FORMING MEMORY DEVICE INVOLVING ION IMPLANTATION OF THE CONTROL GATE SPACER AND WET ETCHING PROCESS TO EXPOSE SIDEWALL OF CONTROL GATE

(71) Applicant: Winbond Electronics Corp., Taichung (TW)

(72) Inventors: Hsu-Chi Cho, Zhubei (TW); Cheng-Ta Yang, Kaohsiung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 34 days.

(21) Appl. No.: 16/374,351

(22) Filed: Apr. 3, 2019

(65) Prior Publication Data
US 2019/0348426 A1 Nov. 14, 2019

(30) Foreign Application Priority Data

May 11, 2018 (TW) .............................. 107116122 A (51) Int. Cl.
| | |
|---|---|
| *H01L 27/11521* | (2017.01) |
| *H01L 29/66* | (2006.01) |
| *H01L 21/3115* | (2006.01) |
| *H01L 21/3215* | (2006.01) |
| *H01L 21/3205* | (2006.01) |

(Continued)

(52) U.S. Cl.
CPC .... *H01L 27/11521* (2013.01); *H01L 21/3115* (2013.01); *H01L 21/31111* (2013.01); *H01L 21/31155* (2013.01); *H01L 21/32053* (2013.01); *H01L 21/32155* (2013.01); *H01L 27/115* (2013.01); *H01L 27/11526* (2013.01); *H01L 27/11531* (2013.01); *H01L 27/11558* (2013.01); *H01L 29/401* (2013.01);
(Continued)

(58) Field of Classification Search
CPC ............. H01L 27/115; H01L 27/11526; H01L 27/11531; H01L 27/11558; H01L 21/3115; H01L 21/31155
See application file for complete search history.

(56) References Cited

U.S. PATENT DOCUMENTS

| | | | |
|---|---|---|---|
| 9,502,244 B2 | 11/2016 | Lin et al. | |
| 2004/0061169 A1* | 4/2004 | Leam | ................... H01L 27/105 257/315 |

(Continued)

FOREIGN PATENT DOCUMENTS

| | | |
|---|---|---|
| TW | 200939347 A | 9/2009 |
| TW | 201613073 A | 4/2016 |

(Continued)

*Primary Examiner* — Ermias T Woldegeorgis
(74) *Attorney, Agent, or Firm* — Muncy, Geissler, Olds & Lowe, P.C.

(57) ABSTRACT

A method for forming a memory device is provided. The method includes forming a floating gate on a substrate, and forming a control gate on the floating gate. The method also includes forming a mask layer on the control gate, and forming a spacer on a sidewall of the mask layer, wherein a sidewall of the control gate and a sidewall of the floating gate is covered by the spacer. The method further includes performing an ion implantation process to implant a dopant into a top portion of the spacer, and performing a wet etching process to expose the sidewall of the control gate.

20 Claims, 9 Drawing Sheets

(51) Int. Cl.
*H01L 29/49* (2006.01)
*H01L 29/40* (2006.01)
*H01L 21/311* (2006.01)
*H01L 21/28* (2006.01)
*H01L 27/11531* (2017.01)
*H01L 27/11558* (2017.01)
*H01L 27/11526* (2017.01)
*H01L 27/115* (2017.01)
*H01L 29/788* (2006.01)

(52) U.S. Cl.
CPC .... *H01L 29/40114* (2019.08); *H01L 29/4933* (2013.01); *H01L 29/66825* (2013.01); *H01L 29/7883* (2013.01)

(56) References Cited

U.S. PATENT DOCUMENTS

| | | | |
|---|---|---|---|
| 2006/0205160 A1* | 9/2006 | Lee | H01L 27/11524 438/266 |
| 2008/0087935 A1* | 4/2008 | Matsuno | H01L 27/11519 257/316 |
| 2016/0093493 A1* | 3/2016 | Chang | G03F 7/004 438/695 |

FOREIGN PATENT DOCUMENTS

| | | |
|---|---|---|
| TW | 201639014 A | 11/2016 |
| TW | I618195 B | 3/2018 |

* cited by examiner

METHOD FOR FORMING MEMORY DEVICE INVOLVING ION IMPLANTATION OF THE CONTROL GATE SPACER AND WET ETCHING PROCESS TO EXPOSE SIDEWALL OF CONTROL GATE

CROSS REFERENCE TO RELATED APPLICATIONS

This application claims priority of Taiwan Patent Application No. 107116122, filed on May 11, 2018, the entirety of which is incorporated by reference herein.

BACKGROUND

Field of the Invention

The invention relates to a method for forming a memory device, and in particular to a method for forming a non-volatile memory device.

Description of the Related Art

Flash memory is widely used in enterprise servers, storage and networking technology, and a wide range of consumer electronic products, such as USB flash drives, mobile phones, digital cameras, tablet computers, PC cards in notebook computers, and embedded controllers.

Although existing methods for forming non-volatile memory devices have been adequate for their intended purposes, they have not been entirely satisfactory in all respects. Therefore, up to the present, there are still some problems to be overcome in regards to the technologies of non-volatile memory devices.

BRIEF SUMMARY

Some embodiments of the disclosure provide a method for forming a memory device. The method includes forming a floating gate on a substrate, and forming a control gate on the floating gate. The method also includes forming a spacer on a sidewall of the control gate, and performing an ion implantation process to implant a dopant into a top portion of the spacer, wherein after performing the ion implantation process, the top portion of the spacer has a conductivity type that is the same as that of the control gate. The method further includes performing a wet etching process to remove the top portion of the spacer.

Some embodiments of the disclosure provide a method for forming a memory device. The method includes providing a substrate comprising a peripheral circuit region and an array region, and forming a first control gate and a second control gate on the peripheral circuit region of the substrate, wherein a first trench is between the first control gate and the second control gate. The method also includes forming a spacer on a sidewall of the first trench, wherein a top surface of the spacer is higher than a top surface of the first control gate and a top surface of the second control gate. The method further includes performing an ion implantation process to implant a dopant into the spacer, the first control gate and the second control gate, and after performing the ion implantation process, performing a wet etching process to expose the sidewall of the first trench.

A detailed description is given in the following embodiments with reference to the accompanying drawings.

DETAILED DESCRIPTION OF THE INVENTION

The following disclosure provides many different embodiments, or examples, for implementing different features of the subject matter provided. Specific examples of components and arrangements are described below to simplify the present disclosure. These are, of course, merely examples and are not intended to be limiting. The thicknesses of the layers and the regions in the drawings may be enlarged for clarification. In addition, the same or similar reference numerals may be used to indicate the same or similar elements. These will not be repeated in the following disclosure.

Figure 7:
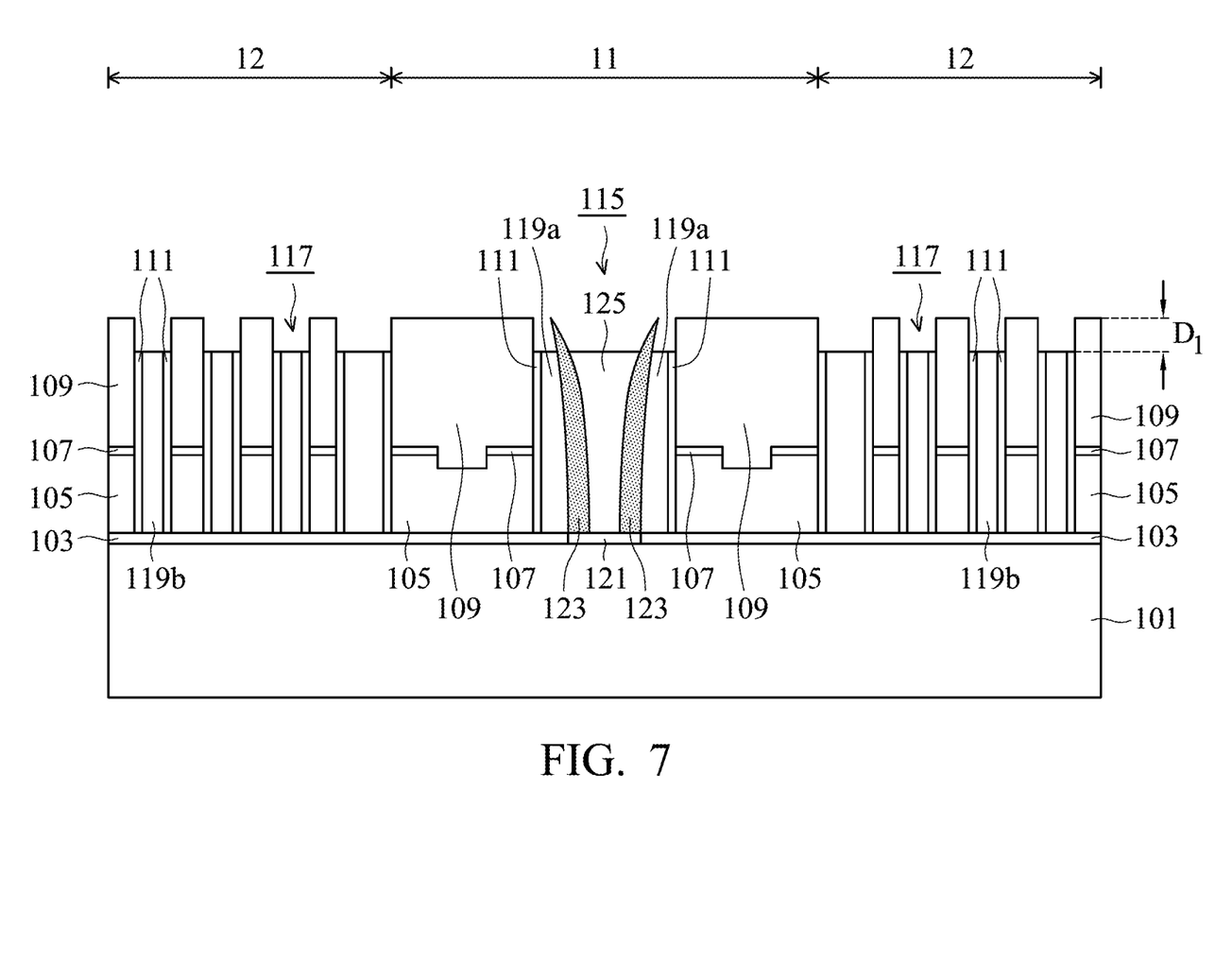
Figure 8:
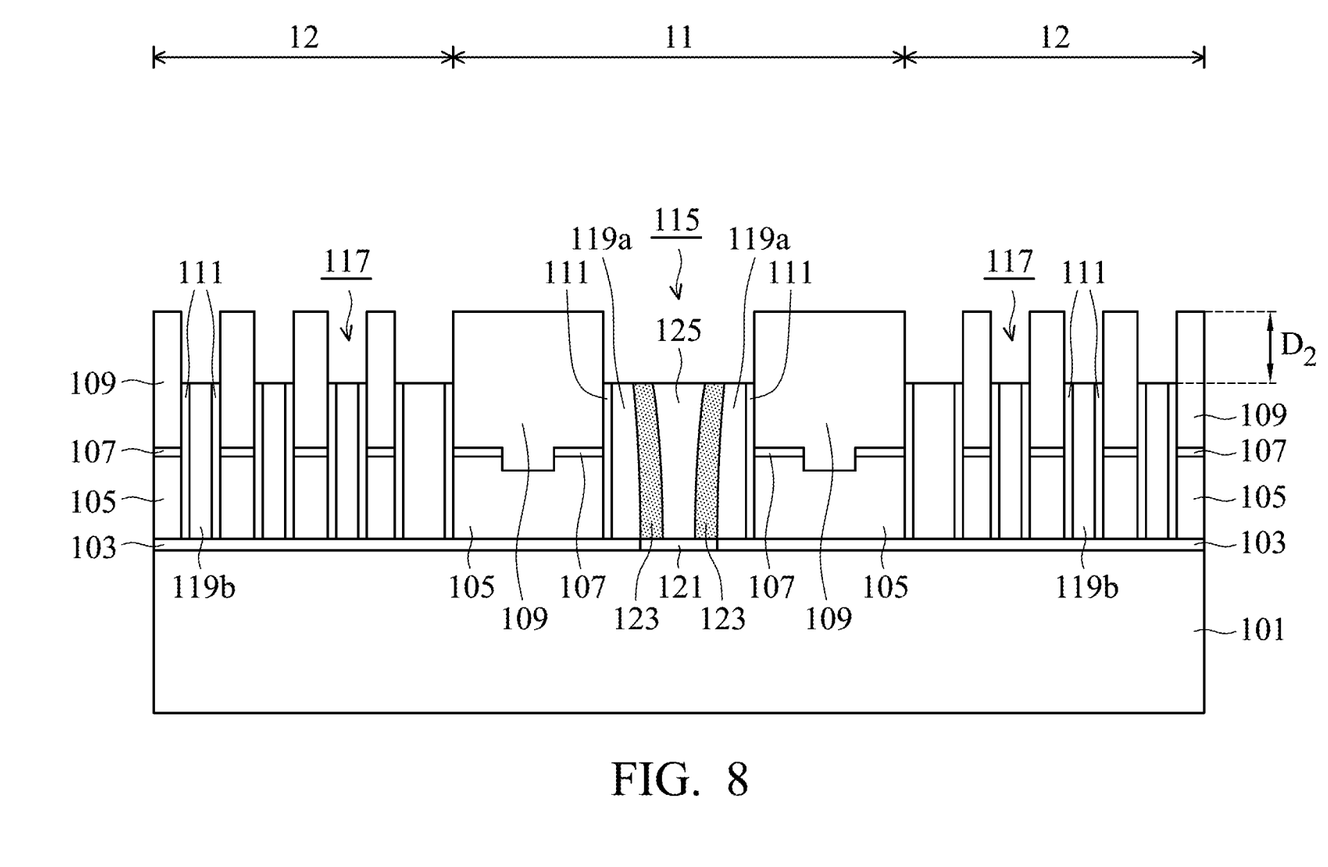
Figure 9:
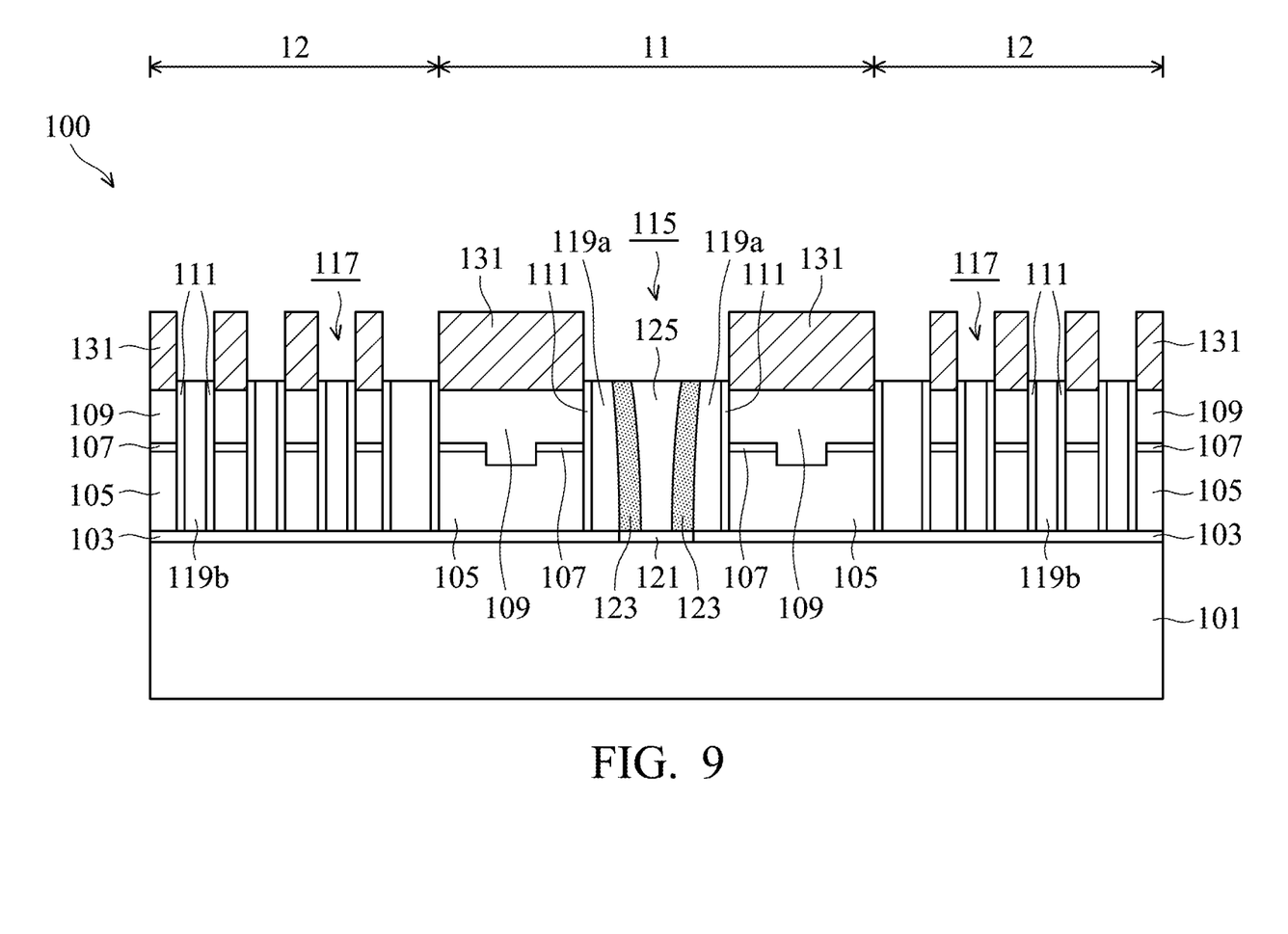

FIGS. 1-9 are cross-sectional views illustrating various steps for forming a memory device 100 of FIG. 9 in accordance with some embodiments of the present disclosure.

Figure 1:
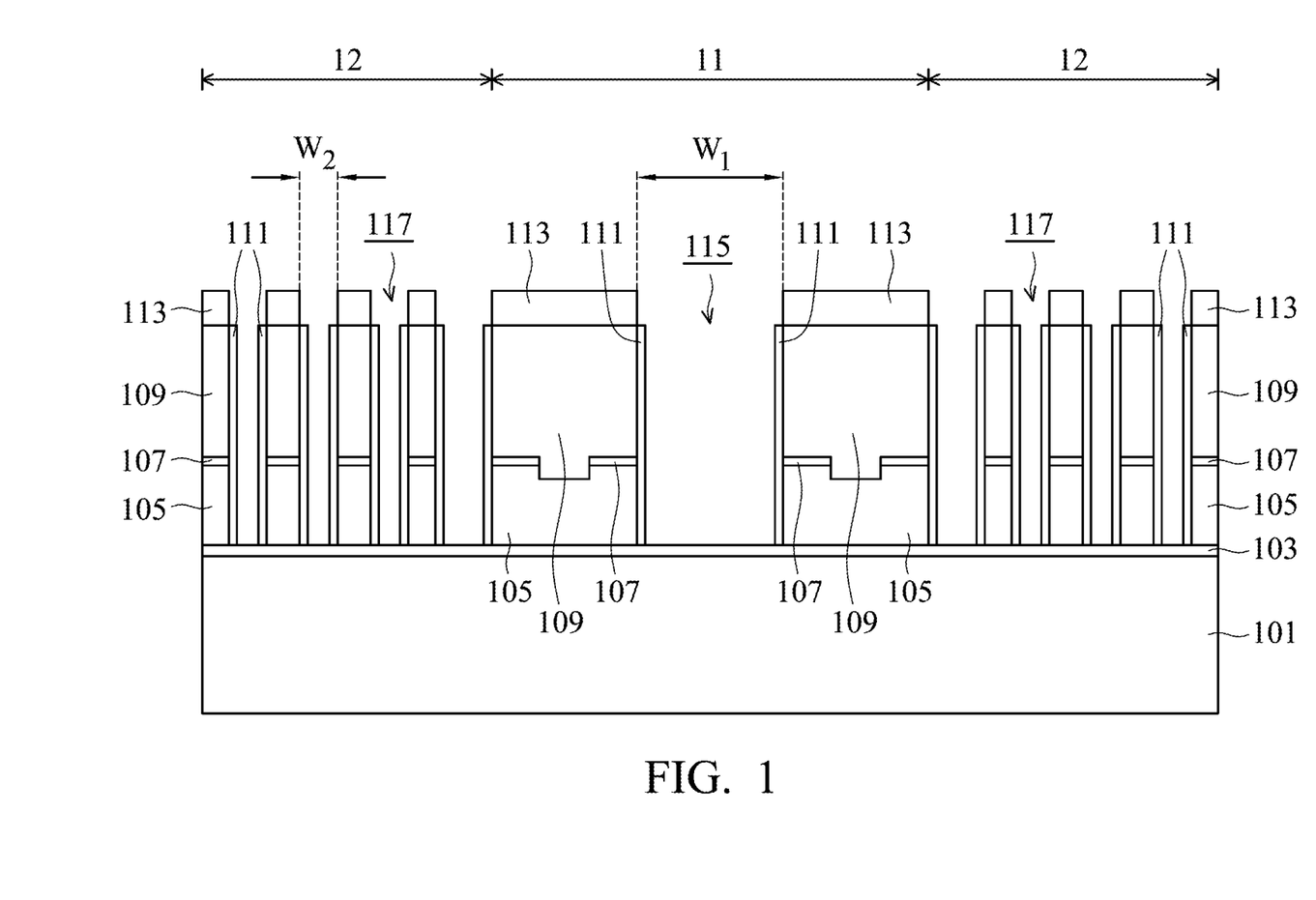
FIGS. 1-9 are cross-sectional views illustrating various steps for forming a memory device in accordance with some embodiments of the present disclosure.

As shown in FIG. 1, a substrate 101 is provided, and the substrate 101 includes a peripheral circuit region 11 and array regions 12 adjacent to the peripheral circuit region 11. In some embodiments, the materials of the substrate 101 may include silicon, gallium arsenic, gallium nitride, silicon germanium, semiconductor-on-insulator (SOI), another applicable material or a combination thereof.

In some embodiments, a tunnel oxide layer 103 is formed on the substrate 101. Then, a plurality of floating gates 105, a plurality of dielectric layers 107 and a plurality of control gates 109 are sequentially formed on the tunnel oxide layer 103. The materials of the floating gates 105 and the control gates 109 may include polysilicon, and the floating gates 105 and the control gates 109 may be formed by using depositing process and patterning process. In addition, a dopant may be optionally implanted into the floating gates 105 and the control gates 109. In the present embodiment, a p-type dopant can be implanted into the floating gates 105 and the control gates 109, such as phosphorous (P). In some embodiments, the floating gates 105 and the control gates 109 may be single-layer or multilayer structures individually. Moreover, the dielectric layers 107 are dielectric layers between the floating gates 105 and the control gates 109, and the dielectric layers 107 may be multilayer structures, such as multilayer structures formed by oxide-nitride-oxide (ONO).

Still referring to FIG. 1, an oxide layer 111 may be formed on two opposite sidewalls of each of the floating gates 105, each of the dielectric layers 107 and each of the control gates 109, and a mask layer 113 is formed on each of the control gates 109. In some embodiments, the floating gates 105, the dielectric layers 107 and the control gates 109 are formed by a patterning process using the mask layer 113 as a mask. Therefore, the floating gates 105, the dielectric layers 107 and the control gates 109 have coplanar sidewalls.

Furthermore, in some embodiments, the top surface of the oxide layer 111 and the top surfaces of the control gates 109 are substantially coplanar. In other words, the two opposite sidewalls of the mask layer 113 are not covered by the oxide layer 111. In addition, the material of the mask layer 113 may be oxide, such as tetraethyl orthosilicate (TEOS) oxide.

In the peripheral circuit region 11, a first trench 115 is between the two adjacent floating gates 105, the two adjacent dielectric layers 107 and the two adjacent control gates 109, and the first trench 115 has a width $W_1$. In the array regions 12, second trenches 117 are between the two adjacent floating gates 105, the two adjacent dielectric layers 107 and the two adjacent control gates 109, and each of the second trenches have a width $W_2$. It is worth noting that the width $W_1$ of the first trench 115 is greater than the width $W_2$ of the second trench 117, and the widths of the control gates 109, the dielectric layers 107 and the floating gates 105 of the peripheral circuit region 11 are greater than the widths of the control gates 109, the dielectric layers 107 and the floating gates 105 of the array regions 12.

In some embodiments, the control gates 109 and the floating gates 105 of the peripheral circuit region 11 are configured to be the control units (also named as the selective gates) of the memory device 100 formed subsequently, and the control gates 109 and the floating gates 105 in the array regions 12 are configured to be the storage units of the memory device 100.

Figure 2:
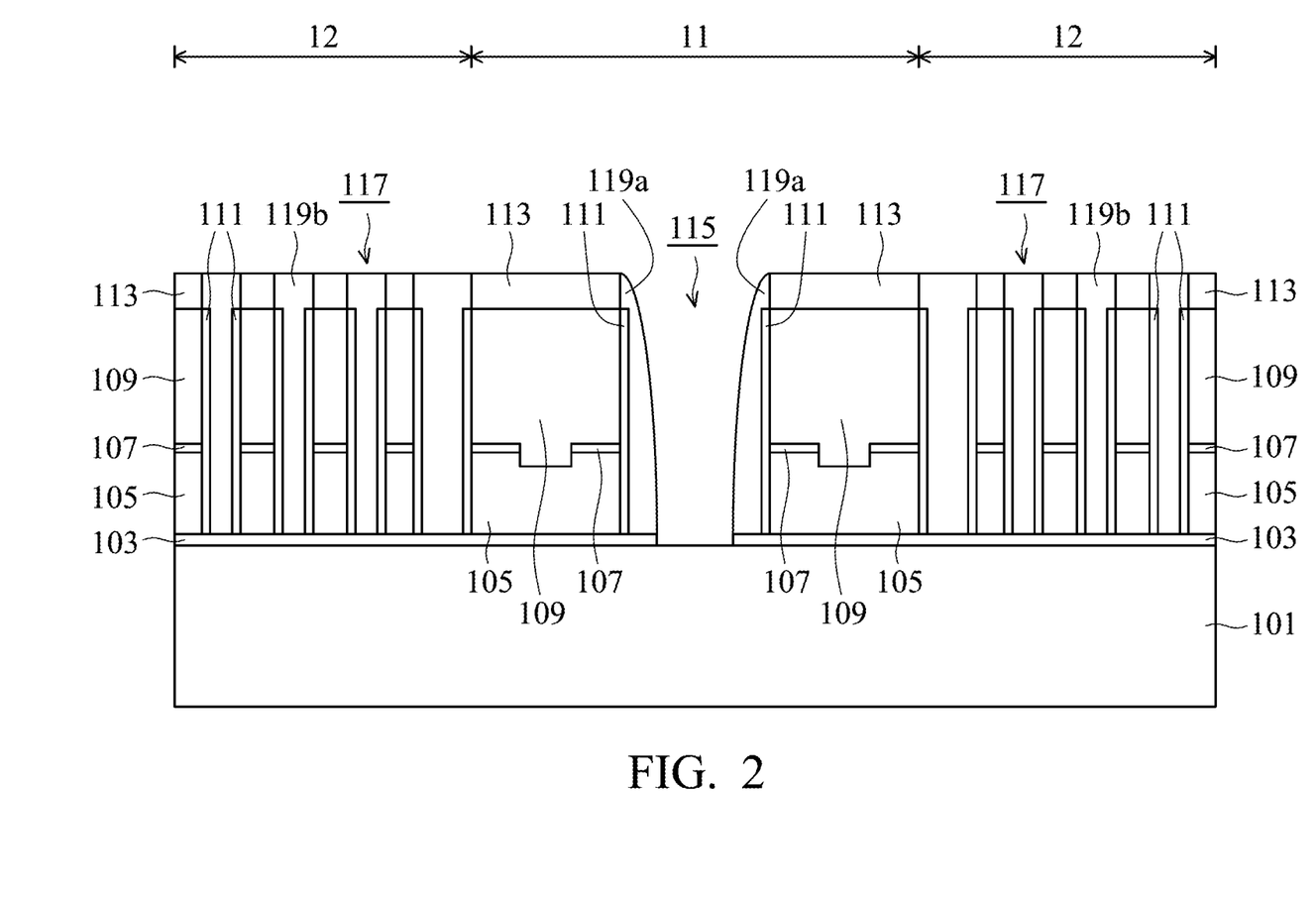

Afterwards, as shown in FIG. 2, spacers 119a are formed in the first trench 115, and a dielectric layer 119b is formed in the second trenches 117. In some embodiments, the spacers 119a and the dielectric layer 119b may include the same material, and the spacers 119a and the dielectric layer 119b may be formed by the same process. For example, the spacers 119a and the dielectric layer 119b may be made of silicon oxide.

The forming methods of the spacers 119a and the dielectric layer 119b include conformally forming a spacer material layer (not shown) on the mask layer 113, in the first trench 115 and in the second trenches 117. Since the width $W_1$ of the first trench 115 is greater than the width $W_2$ of the second trench 117, when the spacer material layer is formed, the spacer material layer may have different profiles in the peripheral circuit region 11 and in the array regions 12. Specifically, the second trenches 117 of the array regions 12 may be filled up with the spacer material layer, but the first trench 115 of the peripheral circuit region 11 may be not filled up with the spacer material layer.

Subsequently, an etch back process is performed to remove the spacer material layer on the mask layer 113, and a portion of the spacer material layer and a portion of the tunnel oxide layer 103 in the first trench 115 are removed at the same time. After the etch back process, a portion of the top surface of the substrate 101 is exposed. As a result, spacers 119a are formed on sidewalls of the first trench 115, and a dielectric layer 119b filling up the second trenches 117 is also formed. It is worth noting that the top surfaces of the control gates 109 are covered by the mask layer 113, and the top surfaces of the spacers 119a are higher than the top surfaces of the control gates 109. In other words, the sidewalls of the mask layer 113, the sidewalls of the control gates 109 and the sidewalls of the floating gates 105 are covered by the spacers 119a.

Figure 3:
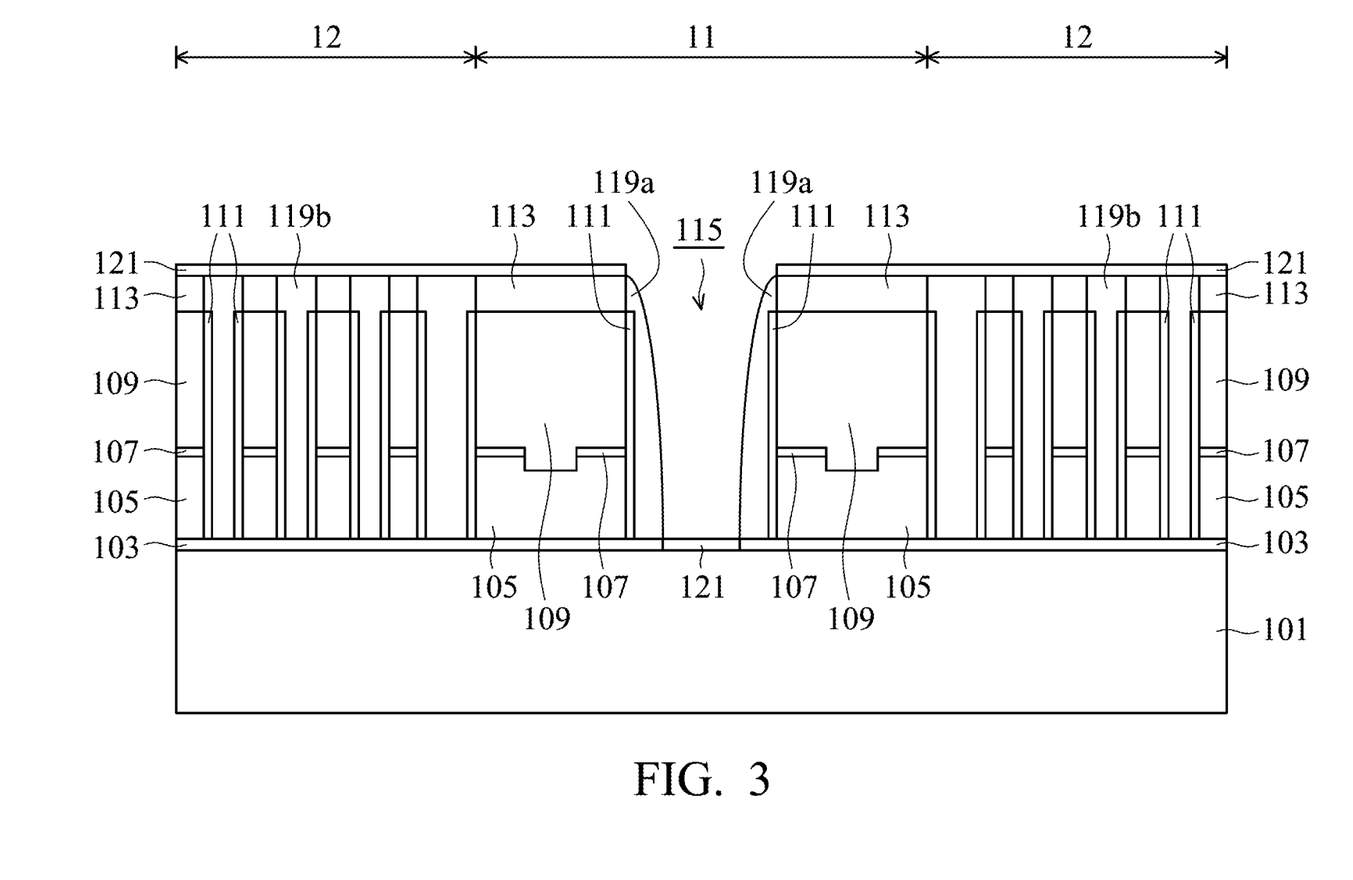

As shown in FIG. 3, in accordance with some embodiments, a dielectric layer 121 is formed on the top surface of the mask layer 113, the top surface of the dielectric layer 119b and the exposed top surface of the substrate 101. The material of the dielectric layer 121 may be silicon oxide, and the dielectric layer 121 may be formed by any applicable deposition process. Then, a dopant may be implanted into the substrate 101 in the first trench 115 by using a mask layer (not shown). For example, the dopant may be p-type.

Figure 4:
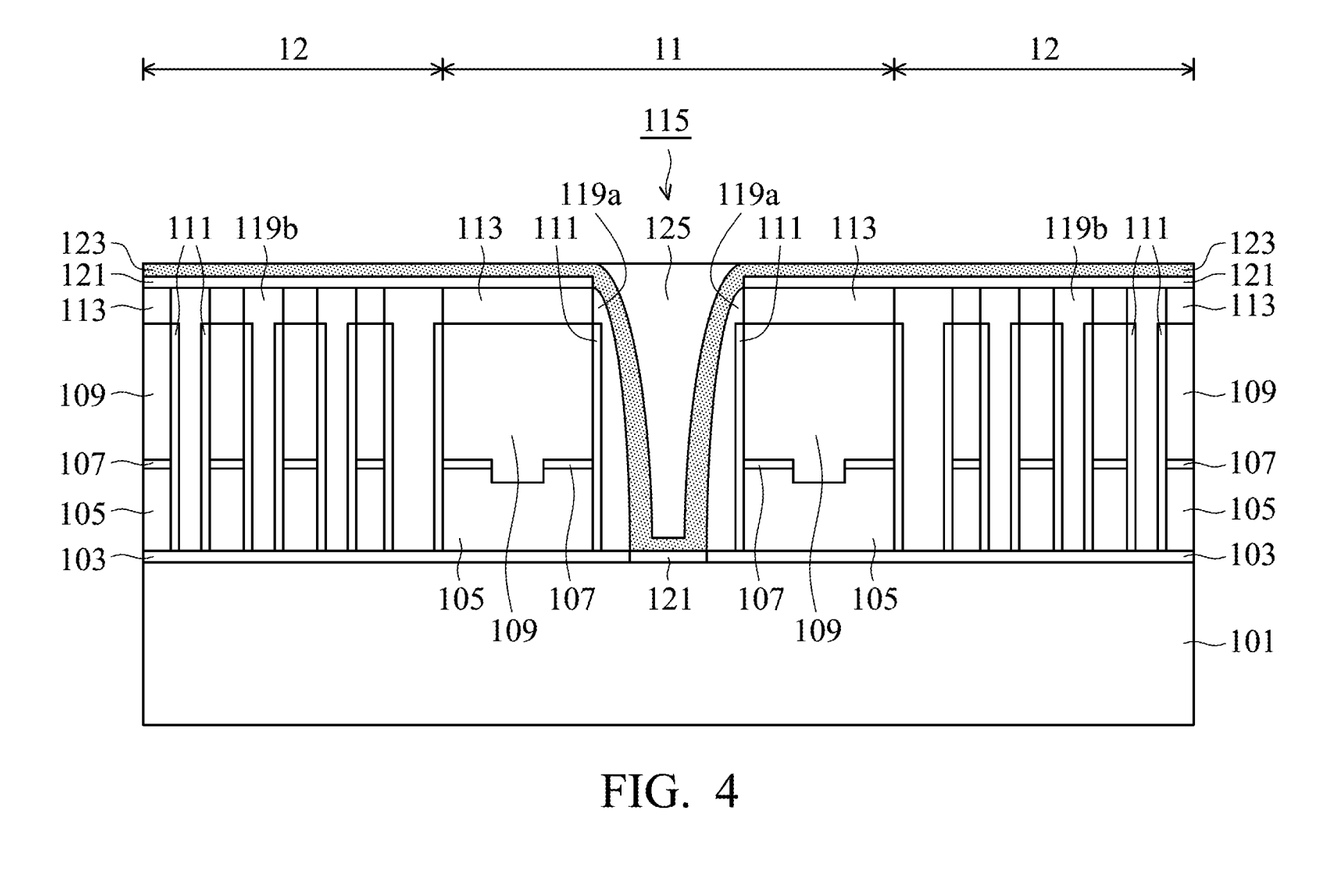

Next, as shown in FIG. 4, a liner layer 123 is conformally formed on the dielectric layer 121 and in the first trench 115, and a filling dielectric layer 125 is formed on the liner layer 123 in the first trench 115. In some embodiments, the material of the liner layer 123 may be silicon nitride, and the liner layer 123 may be formed by any applicable deposition process. Specifically, the sidewalls of the spacers 119a in the first trench 115 and the top surface of the dielectric layer 121 are covered by the liner layer 123.

In addition, the material of the filling dielectric layer 125 may be silicon oxide, and the filling dielectric layer 125 may be formed by any applicable deposition process. The forming methods of the filling dielectric layer 125 include forming a dielectric material layer (not shown) on the liner layer 123, and then, performing a chemical mechanical polishing (CMP) process to remove the dielectric material layer outside of the first trench 115. The portion of the dielectric material layer that remains on sidewalls of the liner layer 123 in the first trench 115 becomes the filling dielectric layer 125.

Figure 5:
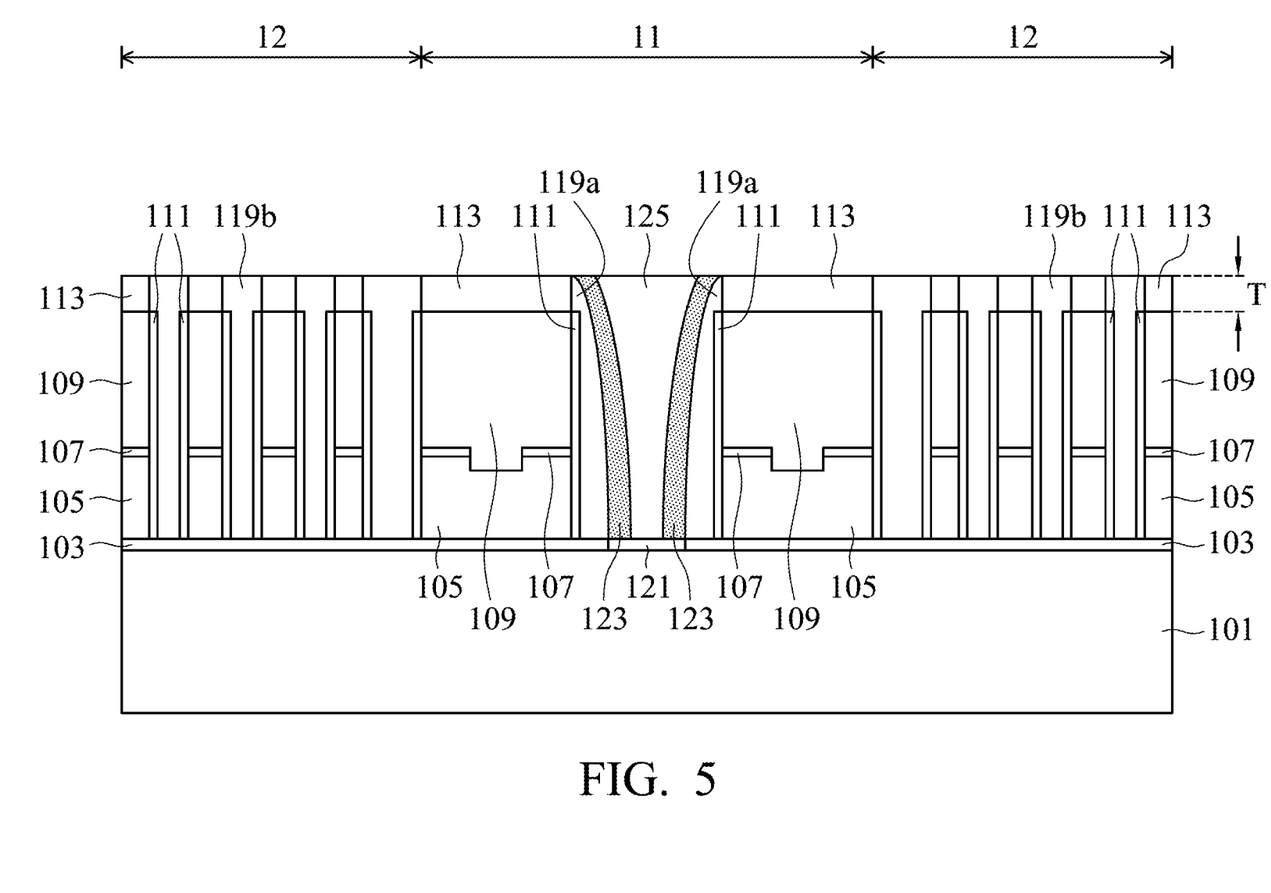

Afterwards, as shown in FIG. 5, an etching process, such as a dry etching process, is performed to remove the liner layer 123, the dielectric layer 121, a portion of the mask layer 113 and a portion of the dielectric layer 119b which are disposed on the mask layer 113. As a result, the mask layer 113 that remains has a thickness T. In some embodiments, the thickness T is about 25 nm. In this step, a portion of the mask layer 113 is remained in order to secure the control gates 109 from being affected by the dry etching.

Figure 6:
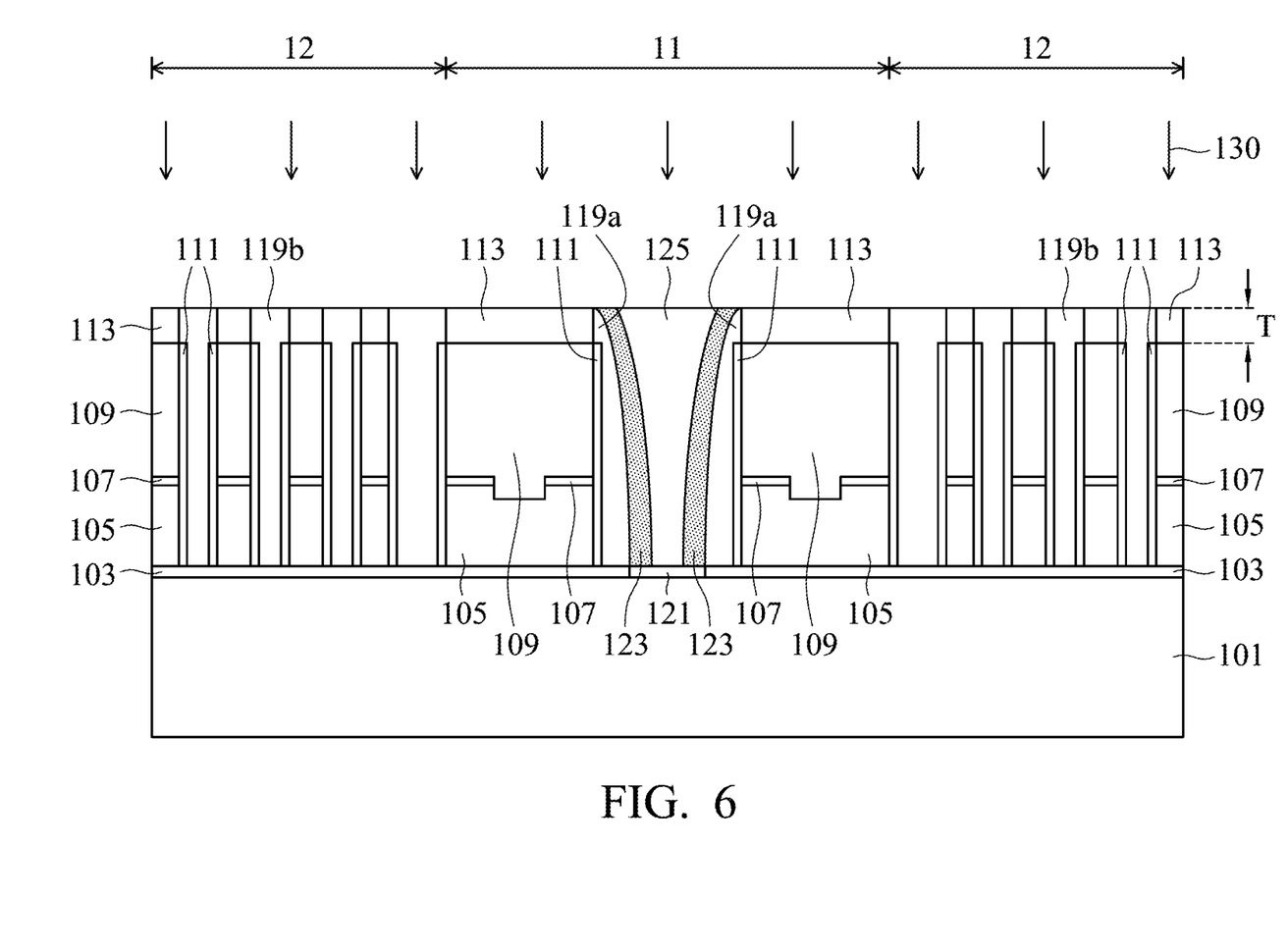

As shown in FIG. 6, in accordance with some embodiments, an ion implantation process 130 is performed to implant a dopant into the top portions of the spacers 119a. In some embodiments, the dopant may be implanted into the mask layer 113, the dielectric layer 119b, the spacers 119a, the liner layer 123, the filling dielectric layer 125, the oxide layer 111 and the control gates 109 comprehensively. Specifically, the dopant may be implanted into the top portion of the dielectric layer 119b, the top portions of the spacers 119a, the top portion of the liner layer 123, the top portion of the filling insulating layer 125, the top portion of the oxide layer 111 and the top portions of the control gates 109.

In some embodiments, the dopant used in the ion implantation process 130 has the same conductivity type as that of the dopant of the control gates 109 and the floating gates 105. In the present embodiment, a p-type dopant can be used, such as phosphorous (P). Moreover, the implant energy of the ion implantation process 130 is in a range from about 30 keV to about 50 keV, and the doping dose is in a range from about 2.5E15 ions/cm$^2$ to about 5E15 ions/cm$^2$. However, in other embodiments, another p-type dopant or another dopant having another conductivity type may be used. The implant energy and the doping dose of the ion implantation process 130 may be adjusted according to actual requirement of the process, and are not limited to the aforementioned range.

Subsequently, as shown in FIG. 7, a wet etching process is performed to expose portions of the sidewalls of the control gates 109. Specifically, the wet etching process is performed to remove the mask layer 113, and the top portion of the dielectric layer 119b, the top portions of the spacers 119a, the top portion of the filling dielectric layer 125 and the top portion of the oxide layer 111 which were doped with the dopant in the aforementioned process. In other words, after performing the wet etching process, portions of the sidewalls of the first trench 115 and portions of the sidewalls of the second trenches 117 are exposed.

In the present embodiment, buffered hydrofluoric acid (BHF) is used as the etchant in the wet etching process. The mask layer 113, a portion of the dielectric layer 119b, portions of the spacers 119a, a portion of the filling dielectric layer 125 and a portion of the oxide layer 111 which are made of oxide are removed by using the buffered hydrofluoric acid in the etching process. It is worth noting that the liner layer 123 which is made of silicon nitride is not removed by the buffered hydrofluoric acid. In other embodiments, another applicable etchant may be used in wet etching process.

After performing the wet etching process, a first height difference $D_1$ is between the top surface of the remaining dielectric layer 119b and the top surfaces of the adjacent control gates 109. The first height difference $D_1$ is about 50 nm. In addition, the top surfaces of the remaining spacers 119a are substantially coplanar with the top surface of the remaining dielectric layer 119b. Therefore, in the peripheral circuit region 11, the top surfaces of the remaining spacers 119a and the top surfaces of the adjacent control gates 109 also have the first height difference $D_1$ between them.

Then, as shown in FIG. 8, a dry etching process, such as a reactive ion etch (RIE), is performed to remove the top portion of the liner layer 123 in which the dopant is implanted in the aforementioned process. Specifically, the etching selectivity of the oxide to the nitride in the dry etching process is 1:1. Therefore, a portion of the dielectric layer 119b, portions of the spacers 119a, a portion of the filling dielectric layer 125 and a portion of the oxide layer 111 are simultaneously removed during the dry etching process.

Moreover, after performing the dry etching process, a second height difference $D_2$ is between the top surface of the remaining dielectric layer 119b and the top surfaces of the adjacent control gates 109. The second height difference $D_2$ is greater than the first height difference $D_1$, and the second height difference $D_2$ is about 70 nm. In addition, the top surfaces of the remaining spacers 119a are substantially coplanar with the top surface of the remaining dielectric layer 119b. Therefore, in the peripheral circuit region 11, the top surfaces of the remaining spacers 119a and the top surfaces of the adjacent control gates 109 also have the second height difference $D_2$ between them.

In the present embodiment, the wet etching process and the dry etching process are used to expose portions of the control gates 109, and the exposed portions of the control gates 109 (also called protruding portions) have a height which is about 70 nm. However, in another embodiment, the dry etching process may be omitted. For example, a single or multiple wet etching processes may be used to expose about 70 nm of the control gates 109.

Accordingly, the oxides on the sidewalls of the first trench 115 and the second trenches (such as the oxide layer 111, the spacers 119a and the dielectric layer 119b) are isotropically removed by performing the wet etching process. By controlling the time duration of the wet etching process, a flat surface can be formed in the first trench 115 and the second trenches 117 after the wet etching process is performed. In other words, in the first trench 115, the top surfaces of the remaining spacers 119a and the remaining oxide layer 111 and the sidewalls of the adjacent control gates 109 have an included angle of about 90 degrees. Similarly, in the second trenches 117, the top surfaces of the remaining dielectric layer 119b and the remaining oxide layer 111 and the sidewalls of the adjacent control gates 109 have an included angle of about 90 degrees.

Moreover, the ion implantation process 130 is performed before the wet etching process, such that the etchant can be prevented from etching downwardly along voids and pores in the oxides (such as the oxide layer 111, the spacers 119a and the dielectric layer 119b). As a result, after the wet etching process, each of the exposed sidewall portions of the control gates 109 may have substantially the same heights (such as about 70 nm). On the other hand, since the dopant used in the ion implantation process 130 has the same conductivity type as that of the dopant of the control gates 109 and the floating gates 105 (or the same dopant), the electrical properties of the control gates 109 and the floating gates 105 will not affected by performing the ion implantation process 130.

As shown in FIG. 9, in accordance with some embodiments, the protruding portions of the control gates 109 are transformed into metal silicide layers 131. The forming methods of the metal silicide layers 131 include forming metal layers (not shown) on the control gates 109. Then, an annealing process is performed to carry out a metal silicide reaction, and the top portions of the control gates 109 and the metal layers thereon are transformed into the metal silicide layers 131 by the metal silicide reaction.

In some embodiments, the materials of the metal layers may include cobalt (Co), nickel (Ni) or another applicable metal. Moreover, the metal layers may be formed by a physical vapor deposition (PVD) process, a sputtering process or another applicable process. In some embodiments, one or more annealing processes may be used to carry out the metal silicide reaction. For example, a first annealing process may be performed at the temperature in a range from about 400° C. to about 600° C., and then a second annealing process may be performed at the temperature in a range from about 600° C. to about 800° C. After performing the annealing process, the metal silicide layers 131 including cobalt dioxide ($CoSi_2$), cobalt silicide (CoSi) or a mixture thereof are formed.

After performing the annealing process, following process steps are performed to complete the memory device 100. For example, contact plugs (not shown) for electrical connections are formed on the metal silicide layers 131 in the peripheral circuit region 11.

It is worth noting that the bottom surfaces of the metal silicide layers 131 are lower than the top surfaces of the spacers 119a. That is, portions of the sidewalls of the metal silicide layers 131 are covered by the spacers 119a. On the other hand, in the array regions 12, the top surface of the dielectric layer 119b in the second trenches 117 is higher than the bottom surfaces of the metal silicide layers 131.

In some embodiments of the present disclosure, the wet etching process is performed to isotropically remove the oxides on the sidewalls of the first trench 115 and the second trenches 117, such that the remaining spacers 119a, the remaining dielectric layer 119b and the remaining oxide layer 111 have flat and smoothing top surfaces. Moreover, the problem of plasma charging damage which may be easily caused by the dry etching process can be prevented by using the wet etching process.

In addition, by performing the ion implantation process 130 before the wet etching process, the wet etchant can be prevented from etching downwardly along voids and pores in the oxides. As a result, after the wet etching process, each of the exposed sidewall portions of the control gates 109 may have substantially the same heights. On the other hand, since the dopant used in the ion implantation process 130 has the same conductivity type as that of the dopant of the control gates 109 and the floating gates 105 (or the same dopant), the electrical properties of the control gates 109 and the floating gates 105 will not affected by performing the ion implantation process 130.

What is claimed is:

1. A method for forming a memory device, comprising:
    forming a floating gate on a substrate;
    forming a control gate on the floating gate;

forming a mask layer on the control gate;
spacer on a sidewall of the mask layer, wherein a sidewall of the control gate and a sidewall of the floating gate is covered by the spacer;
performing an ion implantation process to implant a dopant into a top portion of the spacer; and
performing a wet etching process to expose the sidewall of the control gate.

2. The method as claimed in claim 1, further comprising:
forming a metal layer on the control gate; and
performing an annealing process to carry out a metal silicide reaction, wherein a top portion of the control gate and the metal layer are transformed into a metal silicide layer by the metal silicide reaction.

3. The method as claimed in claim 2, wherein a bottom surface of the metal silicide layer is lower than a top surface of the spacer.

4. The method as claimed in claim 1, wherein the ion implantation process further comprises implanting the dopant into the mask layer and the control gate.

5. The method as claimed in claim 1, further comprising:
forming a liner layer on a sidewall of the spacer; and
forming a filling dielectric layer on a sidewall of a liner layer, wherein the ion implantation process further comprises implanting the dopant into the liner layer and the filling dielectric layer.

6. The method as claimed in claim 1, wherein the wet etching process is performed to remove the mask layer and top portion of the spacer.

7. The method as claimed in claim 1, wherein the spacer and the mask layer are made of oxide, and the wet etching process is performed by using hydrofluoric acid as an etchant.

8. A method for forming a memory device, comprising:
forming a floating gate on a substrate;
forming a control gate on the floating gate;
forming a spacer on a sidewall of the control gate;
performing an ion implantation process to implant a dopant into a top portion of the spacer, wherein after performing the ion implantation process, the top portion of the spacer has a conductivity type that is the same as that of the control gate; and
performing a wet etching process to remove the top portion of the spacer.

9. The method as claimed in claim 8, further comprising:
forming a liner layer on a sidewall of the spacer; and
forming a filling dielectric layer on a sidewall of the liner layer, wherein the ion implantation process further comprises implanting the dopant into a top portion of the liner layer and a top portion of the filling dielectric layer, and the wet etching process further comprises removing the top portion of the filling dielectric layer.

10. The method as claimed in claim 9, further comprising:
after performing the wet etching process, performing a dry etching process to remove the top portion of the liner layer.

11. The method as claimed in claim 8, wherein the dopant is p-type.

12. The method as claimed in claim 8, wherein the ion implantation process further comprises implanting the dopant into a top portion of the control gate.

13. The method as claimed in claim 8, wherein the ion implantation process has an implant energy from 30 keV to 50 keV.

14. The method as claimed in claim 8, wherein the dopant of the ion implantation process has a doping dose of 2.5E15 ions/cm$^2$ to 5E15 ions/cm$^2$.

15. A method for forming a memory device, comprising:
providing a substrate comprising a peripheral circuit region and an array region;
forming a first control gate and a second control gate on the peripheral circuit region of the substrate, wherein a first trench is between the first control gate and the second control gate;
forming a spacer on a sidewall of the first trench, wherein a top surface of the spacer is higher than a top surface of the first control gate and a top surface of the second control gate;
performing an ion implantation process to implant a dopant into the spacer, the first control gate and the second control gate; and
after performing the ion implantation process, performing a wet etching process to expose the sidewall of the first trench.

16. The method as claimed in claim 15, further comprising:
forming a third control gate and a fourth control gate on the array region of the substrate, wherein a second trench is between the third control gate and the fourth control gate, and a width of the second trench is less than a width of the first trench; and
forming a dielectric layer in the second trench, wherein the dopant is implanted into the dielectric layer, the third control gate and the fourth control gate in the ion implantation process.

17. The method as claimed in claim 16, wherein the dielectric layer in the array region and the spacer in the peripheral circuit region are made of the same material and are formed by the same process, and a sidewall of the second trench is exposed after performing the wet etching process.

18. The method as claimed in claim 16, further comprising:
after performing the wet etching process, transforming protruding portions of the first control gate, the second control gate, the third control gate and the fourth control gate into a metal silicide layer,
wherein the top surface of the spacer in the first trench and a top surface of the dielectric layer in the second trench are higher than a bottom surface of the metal silicide layer.

19. The method as claimed in claim 15, further comprising:
forming a mask layer on the first control gate and the second control gate;
conformally forming a spacer material layer on the mask layer and in the first trench; and
removing a portion of the spacer material layer to expose the substrate by etching, and forming the spacer on the sidewall of the first trench.

20. The method as claimed in claim 15, further comprising:
forming a liner layer in the first trench and on a sidewall of the spacer, wherein a bottom surface of the first trench is covered by the liner layer; and
forming a filling dielectric layer on the liner layer, wherein the ion implantation process further comprises implanting the dopant into the liner layer and the filling dielectric layer.

* * * * *